United States Patent [19]

Fukushima

[11] 4,320,411
[45] Mar. 16, 1982

[54] INTEGRATED CIRCUIT WITH DOUBLE DIELECTRIC ISOLATION WALLS

[75] Inventor: Toshitaka Fukushima, Yokohama, Japan

[73] Assignee: Fujitsu Limited, Kanagawa, Japan

[21] Appl. No.: 69,349

[22] Filed: Aug. 24, 1979

[30] Foreign Application Priority Data

Aug. 25, 1978 [JP] Japan ............................ 53-116318[U]

[51] Int. Cl.³ .............................................. H01L 27/04
[52] U.S. Cl. ......................................... 357/50; 357/35; 357/38; 357/92
[58] Field of Search ................... 357/50, 55, 48, 49, 357/38, 86

[56] References Cited

U.S. PATENT DOCUMENTS

| | | | |
|---|---|---|---|
| 3,386,865 | 6/1968 | Doo | 357/50 |
| 3,575,646 | 4/1971 | Karcher | 357/38 |
| 3,590,345 | 6/1971 | Brewer et al. | 357/48 |
| 3,878,551 | 4/1975 | Callahan, Jr. | 357/86 |
| 3,945,857 | 3/1976 | Schinella | 357/50 |
| 3,979,237 | 9/1976 | Morcom et al. | 357/50 |
| 4,081,823 | 3/1978 | Cook | 357/50 |

OTHER PUBLICATIONS

Hamilton & Howard, Basic Integrated Circuit Engineering, McGraw-Hill, N.Y. 1975, pp. 85-88.

*Primary Examiner*—William D. Larkins
*Attorney, Agent, or Firm*—Staas & Halsey

[57] ABSTRACT

A semiconductor integrated circuit comprising a semiconductor substrate, an epitaxial layer formed on the semiconductor substrate, which is of a conductivity type opposite to that of the substrate, a buried layer of a conductivity type opposite to that of the semiconductor substrate, lying between the semiconductor substrate and the epitaxial layer, a dielectric isolation region arranged apart from the buried layer and extending from a surface of the epitaxial layer to the semiconductor substrate, and elements formed in a portion of the epitaxial layer enclosed by the dielectric isolation region. The semiconductor integrated circuit is characterized in that an insulative leakage current blocking region is provided in the portion of the epitaxial layer enclosed by said region, in an arrangement enclosing at least a portion of the elements and extending from the surface of the epitaxial layer to the buried layer.

18 Claims, 15 Drawing Figures

INTEGRATED CIRCUIT WITH DOUBLE DIELECTRIC ISOLATION WALLS

BACKGROUND OF THE INVENTION

1. Field of the Invention

The present invention relates to the structure of a semiconductor integrated circuit.

2. The Prior Art

In the manufacture of a semiconductor integrated circuit device, the process of integrating elements forming a pnpn structure, such as a thyristor, into the circuit in a lateral arrangement comprises forming an n type epitaxial layer on a p type silicon semiconductor substrate, then forming a first and a second p type region on said epitaxial layer, followed by forming an n type region in said second p type region. In such a pnpn structure, a parasitic transistor may be formed by said p type region, the n type epitaxial layer and the p type silicon semiconductor substrate. The formation of the parasitic transistor causes the phenomenon that when the pn junction between the p type region and the n type epitaxial layer is forward-biased, the parasitic transistor turns on to allow a leakage current to flow from the p type region via the n type region to the p type silicon semiconductor substrate.

In order to overcome the above-mentioned disadvantage, conventionally, an n+ type buried layer was formed between a portion of said n type epitaxial layer enclosed by a dielectric isolation region and said p type silicon semiconductor substrate. This was done to reduce the current amplification factor of the parasitic transistor so as to lessen the possibility of the transistor turning on. However, with this conventional structure, the integrated circuit cannot withstand a high voltage. In addition, a sufficiently deep dielectric isolation region is required for traversing the epitaxial layer. On the other hand, if the dielectric isolation region has a large depth, it has an increased surface area in proportion to the depth, so that the region occupies a large part of the surface of the epitaxial layer. Furthermore, an uneven surface is caused in the epitaxial layer, so that disconnections in the aluminum-wired layer or the like formed thereon are frequently caused.

SUMMARY OF THE INVENTION

It is an object of the present invention to provide a semiconductor integrated circuit which does not have the above-mentioned conventional disadvantages.

It is a further object of the invention to provide a semiconductor integrated circuit including a pnpn junction in a lateral arrangement which can prevent the formation of a parasitic transistor therein.

It is a still further object of the invention to provide a semiconductor integrated circuit which has an even or smooth surface and which can arrange necessary elements within a small area.

To achieve the objects of the invention, a semiconductor integrated circuit is provided which comprises a semiconductor substrate, an epitaxial layer, which is of a conductivity type opposite to that of the semiconductor substrate, is formed on the semiconductor substrate a buried layer of a conductivity type opposite to that of the substrate, lying between the semiconductor substrate and the epitaxial layer, a dielectric isolation region arranged apart from the buried layer and extending from a surface of the epitaxial layer to the semiconductor substrate, and elements formed in a portion of the epitaxial layer enclosed by the dielectric isolation region. An insulative leakage current blocking region is provided in the portion of the epitaxial layer enclosed by the dielectric isolation region, in an arrangement enclosing at least one portion of the elements and extending from the surface of the epitaxial layer to the buried layer.

Further features and advantages of the present invention will be apparent from the ensuing description with reference to the accompanying drawings to which, however, the scope of the invention is in no way limited.

DESCRIPTION OF THE PREFERRED EMBODIMENTS

Figure 1A:
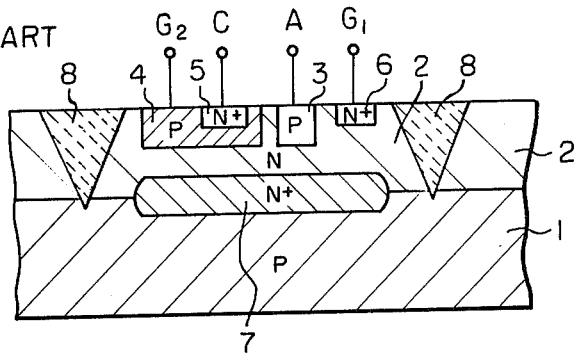
FIGS. 1A, 1B and 1C illustrate examples of conventional semiconductor integrated circuits of lateral pnpn structure.
Figure 2A:
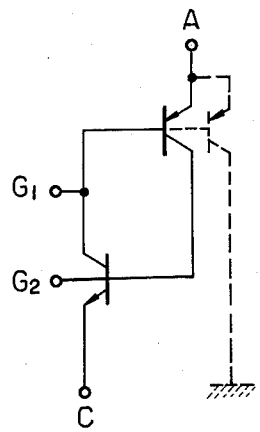
FIGS. 2A, 2B and 2C illustrate the respective equivalent circuits of the semiconductor integrated circuits illustrated in FIGS. 1A, 1B and 1C.

In the manufacture of a semiconductor integrated circuit having a pnpn structure, such as a thyristor, the pnpn structure is formed in a lateral arrangement as an element integrated into the circuit, as shown in FIG. 1A. Two p type regions 3 and 4 are first formed on an n type epitaxial layer 2, which is formed on a p type silicon semiconductor substrate 1. Then, an n type region 5 is formed in the p type region 4. In FIG. 1A, reference numeral 6 designates a contact area disposed in contact with an electrode $G_1$, led from the epitaxial layer 2. Layer 7 is an n+ type buried layer and 8 is a dielectric isolation region made of silicon dioxide or a combination of silicon dioxide and polysilicon. FIG. 2A is a circuit diagram of the pnpn structure illustrated in FIG. 1A.

In the above-described pnpn structure, a parasitic pnp transistor is formed by the p type region 3, the n type epitaxial layer 2 and the p type silicon semiconductor substrate 1, as indicated by a dotted line in FIG. 2A. As a consequence, during its operation, the pn junction between the p type region 3 and the n type epitaxial layer 2 is forward-biased, so that the parasitic transistor turns on thereby causing a flow of leakage current from an anode terminal A toward the p type silicon semiconductor substrate 1.

Figure 1B:
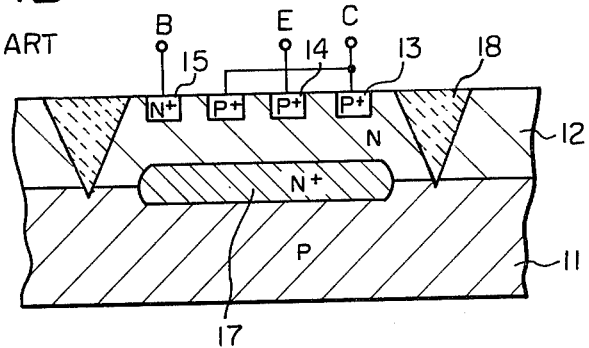
Figure 2B:
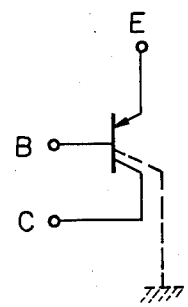

FIG. 1B illustrates the arrangement of a conventional lateral transistor of pnpn structure. In FIG. 1B, reference numeral 11 designates a p type silicon semiconductor substrate, 12 an n+ type epitaxial layer, 13 a p+ type layer, 14 another p+ type layer, 15 an n+ type layer and 17 an n+ type buried layer. Numeral 18 denotes a dielectric isolation region made of silicon dioxide or a combination of silicon, dioxide and polysilicon. Even in this arrangement, a parastic transistor can be formed by the p+ type layers 13, 14, the n+ type epitaxial layer 12 and the p type silicon semiconductor substrate 11, so that the same disadvantage as in the circuit of FIG. 1A is caused. The equivalent circuit of the transistor of FIG. 1B is illustrated in FIG. 2B where the parastic transistor is indicated by a dotted line.

Figure 1C:
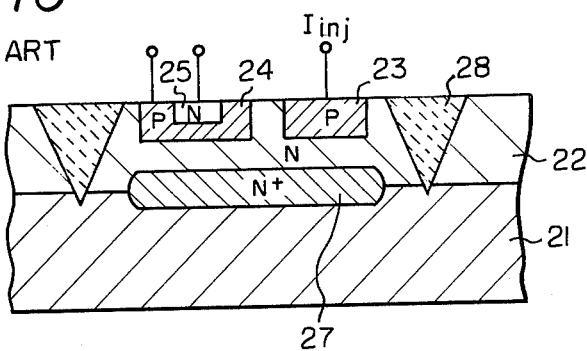
Figure 2C:
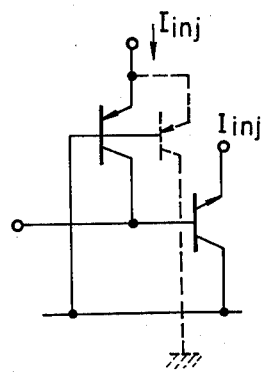

FIG. 1C illustrates the pnpn transistor structure of $I^2L$ (Integrated-Injection Logic) according to the conventional art. In FIG. 1C, reference numeral 21 denotes a p type silicon semiconductor substrate, 22 an n type epitaxial layer, 23 a p type region, 24 a further p type region, 25 an n type region and 27 an n type buried layer. Numeral 28 designates a dielectric isolation region composed of silicon dioxide or a combination of silicon dioxide and polysilicon. Also in this structure, a parastic transistor can be formed between the p type region 23, the n type epitaxial layer 22 and the silicon semiconductor substrate 21, so that a diversion of the injection current, and accordingly, a current dissipation is caused. The equivalent circuit of this structure is illustrated in FIG. 2C.

Figure 3A:
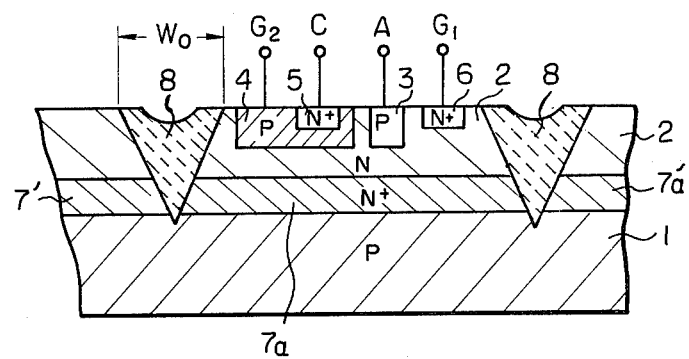
FIGS. 3A and 3B illustrate further examples of the conventional semiconductor integrated circuit which are improvements over the circuits of FIGS. 1A and 1B, respectively.
Figure 3B:
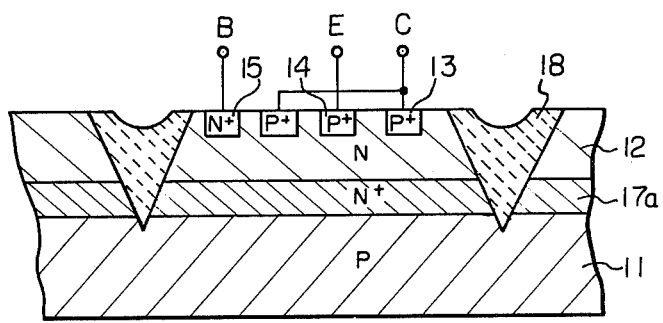

For the purpose of overcoming the above-mentioned disadvantage, it has been proposed to form an n+ type buried layer 7a or 17a between the epitaxial layer 2 or 12 and the silicon semiconductor substrate 1 or 11, which extends over the entire area enclosed by the dielectric isolation region 8 or 18, as shown in FIGS. 3A and 3B, to reduce the current amplification factor $\alpha$ of the parastic pnp transistor formed, so that the possibility of the transistor turning on can be decreased. However, this structure has the disadvantage that it is difficult to apply a high voltage to an integrated circuit employing this structure. Further, the dielectric isolation region 8 or 18 must have a sufficient depth for traversing the epitaxial layer 2 or 12. As a result, the portion of the region corresponding to the surface of the epitaxial layer 2 or 12 necessarily has a larger width Wo as compared with the dielectric isolation regions of the structures of FIGS. 1A and 1B, so that the surface of the dielectric region 8 or 18 occupies a larger part of the whole surface of the epitaxial layer. Further, the epitaxial layer 2 or 12 has an uneven surface, which may cause a disconnection in the aluminum-wired layer or the like formed on the structure.

Figure 4A:
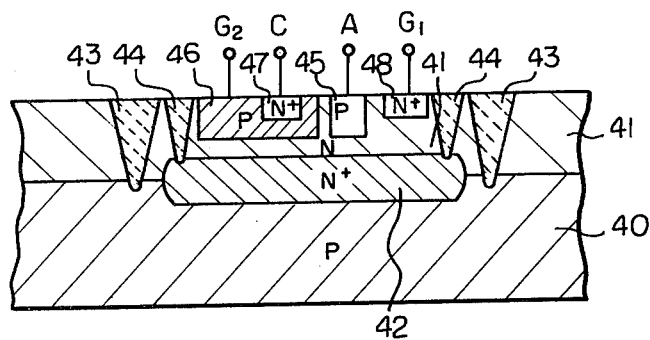
FIGS. 4A, 4B and 4C illustrate embodiments of the semiconductor integrated circuit according to the present invention.
Figure 6A:
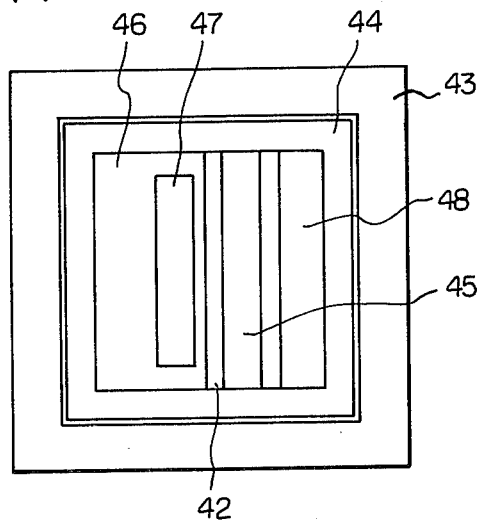
FIGS. 6A and 6B illustrate respective plan views of the semiconductor integrated circuit configurations illustrated in FIGS. 4A and 5B.

FIG. 4A is a sectional elevation of an embodiment of the present invention, and FIG. 6A a plan view of the same. In these figures, reference numeral 40 designates a p type silicon semiconductor substrate having a plane index of [100], 41 designates an n− type epitaxial layer formed on the silicon semiconductor substrate 40, 42 designates a buried layer formed between the silicon semiconductor substrate 40 and the epitaxial layer 41, which is an n+ type conductivity layer. Reference numeral 43 designates a dielectric isolation region formed along the outer periphery of the buried layer 42, which may be formed by an impurity diffusion region of p+ conduction type or an insulator such as silicon dioxide ($SiO_2$). Reference numeral 44 designates a leakage current blocking region according to the present invention which extends along the inner periphery of the dielectric isolation region 43. This leakage current blocking region may have a V-shaped cross section and may be formed by an insulator composed of silicon dioxide ($SiO_2$), or aluminum oxide, such as $Al_2O_3$ or by silicon nitride, such as $Si_3N_4$. This leakage current blocking region 44 may alternatively be formed by an insulation layer on which a polysilicon layer is formed. The bottom end of the region 44 extends to the buried layer 42. Numerals 45 and 46 designate p type regions formed in a portion of the n− type epitaxial layer 41 enclosed by the dielectric isolation region 43. Region 47 is an n type region formed in the p type region 46, and 48 is a contact area formed in the epitaxial layer 41, disposed in contact with an electrode $G_1$ which is connected to the same layer 41. Symbol A denotes an anode which is connected to the p type region 45, C a cathode which is connected to the n type region 47, and $G_2$ a gate which is connected to the p type region 46. In this element, a thyristor of lateral pnpn arrangement is formed by the p type region 45, the n− type epitaxial layer 41, the p type region 46 and the n type region 47.

According to the arrangement of the present invention, since a leakage current blocking region 44 is thus provided in the base region of a parastic pnp transistor, which may be formed by the p type region, the n− epitaxial layer 41 and the p type silicon semiconductor substrate 40, traversing the epitaxial layer 41, the parastic pnp transistor has such a small current amplification factor $\alpha$ that it is almost inoperative as a transistor. As a result, even if a minority carrier is applied to the epitaxial layer 41 through the p type region 45, there occurs no flow of leakage current from the p type region 45 toward the p type silicon semiconductor substrate 40.

Furthermore, since it is sufficient that the dielectric isolation region 43 has its bottom end only extending as deep as the silicon semiconductor substrate 40, it need not have a large depth, so that the surface of the region 43 which occupies the surface of the epitaxial layer 41 can be very small.

Still further, since it is also sufficient that the leakage current blocking region 44 has its bottom end only extending as deep as the upper surface of the buried layer 42, which is above the upper surface of the silicon semiconductor substrate 40, the region 44 can have a smaller depth than the region 43 and its upper surface can have smaller width than the region 43. Accordingly, the element forming region enclosed by the dielectric isolation region can be formed in small area.

In addition, since the epitaxial layer has a lower impurity concentration in the vicinity of its contact area with the silicon semiconductor substrate, the element forming region can withstand higher voltage.

Further, since the surface of the dielectric isolation region and the leakage current blocking region are both so small in area that the semiconductor integrated circuit can be formed with an even or smooth surface. In addition, a disconnection in the wired layer formed thereon can be prevented.

Further, referring to FIG. 4A, the dielectric isolation region 43 has a V-groove form similar to the leakage current blocking region. This V-groove region is formed by anisotropically etching the epitaxial layer 41, which has a plane index [100] and which is formed on the semiconductor substrate 40 having the plane index [100], by using hydrazine solution. When a wide width of the window of the mask for etching the V-groove is used, the depth of the V-groove can be increased. Therefore, when the width of the window of the mask for the region which forms the dielectric isolation region is selected to be larger than the width of the window of the mask for the region which forms the leakage current blocking region, the V-groove region 44 which is used for the leakage current blocking region and which reaches the buried layer 42 and the V-groove region 43 which is used for the dielectric isolation region, which is deeper than the region 44 and which reaches the semiconductor substrate 40 can be formed at the same time by same etching process.

Figure 4B:
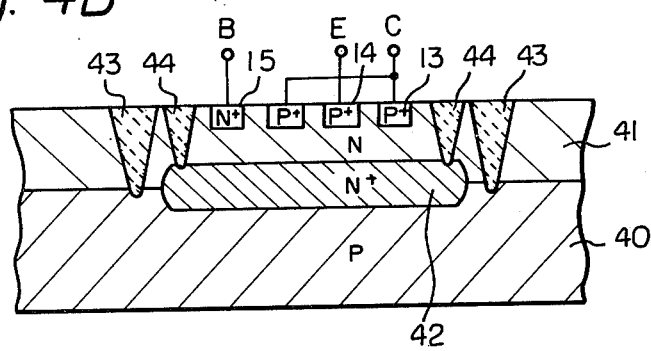
Figure 4C:
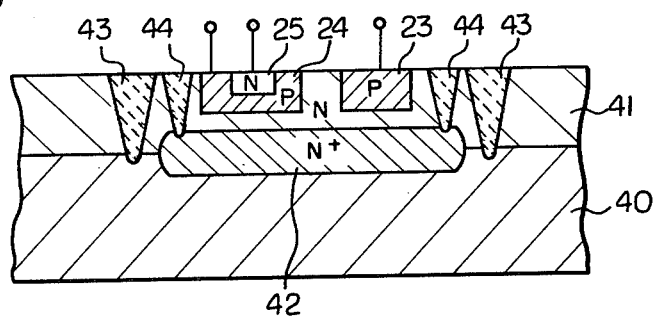

FIG. 4B illustrates an improvement of the embodiment of FIG. 1B according to the present invention. In FIG. 4B, like numerals and symbols are given to parts corresponding to those in FIG. 1B. FIG. 4C illustrates an improvement of the arrangement of FIG. 1C, according to the present invention. Also in this drawing, parts corresponding to those in FIG. 1C are given like numerals and symbols. Similar results to those mentioned above with regard to the arrangement of FIG. 4A can be expected from the arrangement illustrated in FIGS. 4B and 4C as well.

Figure 5A:
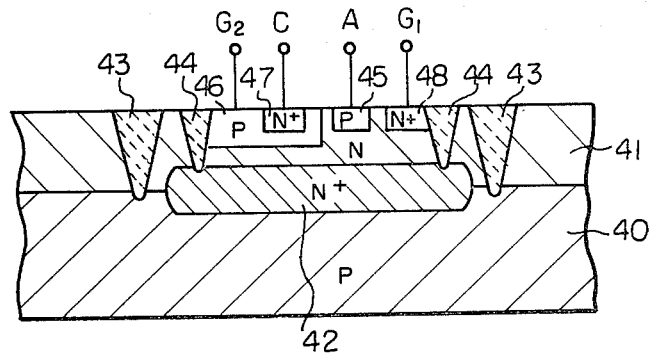
FIGS. 5A and 5B illustrate further embodiments of the semiconductor integrated circuit according to the present invention.
Figure 5B:
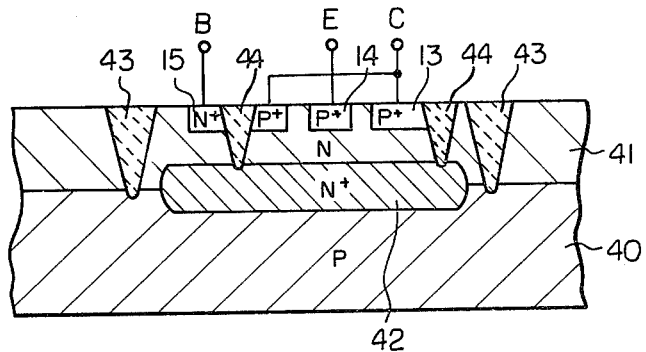
Figure 6B:
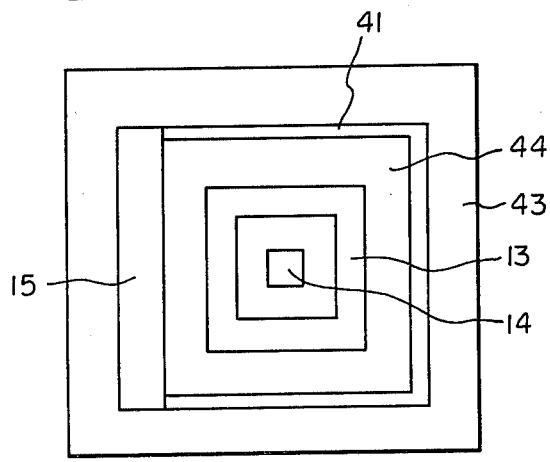

FIG. 5A and FIG. 5B illustrate further embodiments of the invention. The difference of the arrangement of FIG. 5A from that of FIG. 4A lies in the fact that a leakage current blocking region 44 is arranged in contact with the n type region 48 and the p type region 46. While the arrangement of FIG. 5B is distinguished from that of FIG. 4B in that a leakage current blocking region 44 is arranged in contact with the p type region 13 and the n type region 15. Thus, in both these embodiments, the surface area of the structure occupied by the leakage current blocking region and the dielectric isolation region can be designed smaller than the embodiment shown in FIGS. 4A and 4B. A plan view of the arrangement of FIG. 5B is illustrated in FIG. 6B.

As described in detail in the foregoing, according to the present invention, a semiconductor integrated circuit which prevents the formation of a parasitic transistor therein can be formed with an even or smooth surface and the component elements can be integrated within a small area.

Of course, the invention is equally applicable to the complementary versions of the above specific examples, with P and N types reversed.

What is claimed is:
1. A semiconductor integrated circuit comprising:
a semiconductor substrate of a first conductivity type;
a buried layer, of a second conductivity type, formed on a portion of said semiconductor substrate;
an epitaxial layer, of said second conductivity type, formed on said buried layer and formed on the portion of said semiconductor substrate upon which said buried layer is not formed;
a dielectric isolation region which encloses a first portion of said epitaxial layer and which extends from a surface of said epitaxial layer to said semiconductor substrate, said dielectric isolation region comprising a groove;
an insulative leakage current blocking region which encloses a second smaller portion of said epitaxial layer inside said first portion, and which extends from the surface of said epitaxial layer to said buried layer, said insulative leakage current blocking region comprising a groove; and
a lateral semiconductor device formed in said second portion of said epitaxial layer enclosed by said insulative leakage current blocking region, said lateral semiconductor device comprising spaced regions of said first conductivity type.
2. A semiconductor integrated circuit as set forth in claim 1, wherein said dielectric isolation region groove and said insulative leakage current blocking region groove each have a V-shaped cross-section.
3. A semiconductor integrated circuit as set forth in claim 2, wherein insulative material is filled in said dielectric isolation region groove and said insulative leakage current blocking region groove.
4. A semiconductor integrated circuit as set forth in claim 3, wherein said epitaxial layer has a plane index of [100].
5. A semiconductor integrated circuit as set forth in claim 1, wherein said semiconductor device has a pnpn structure and wherein said first conductivity type is p-type.
6. A semiconductor integrated device as set forth in claim 1, wherein said lateral semiconductor device has a lateral npnp structure and wherein said first conductivity type is n-type.
7. A semiconductor integrated circuit as set forth in claim 1, wherein said lateral semiconductor device has a lateral pnp structure and wherein said first conductivity type is p-type.
8. A semiconductor integrated circuit as set forth in claim 1, wherein said lateral semiconductor device has a lateral npn structure and wherein said first conductivity type is n-type.
9. A semiconductor integrated circuit comprising:
a semiconductor substrate of a first conductivity type;
an epitaxial layer formed on said semiconductor substrate, said epitaxial layer being of a second conductivity type opposite to said first conductivity type;
a buried layer, which is of said second conductivity type, lying between said semiconductor substrate and said epitaxial layer;
a dielectric isolation region disposed apart from said buried layer, enclosing a portion of said epitaxial layer and extending from a surface of said epitaxial layer to said semiconductor substrate, said dielectric isolation region comprising a groove;
plural regions of said first conductivity type formed in a portion of said epitaxial layer enclosed by said dielectric isolation region; and
an insulative leakage current blocking region which is provided in the portion of said second conductivity type epitaxial layer enclosed by said dielectric isolation region, said insulative leakage current blocking region enclosing said plural regions and extending from the surface of said epitaxial layer to said buried layer, said insulative leakage current blocking region comprising a groove, said plural regions forming at least part of a lateral semiconductor device.
10. A semiconductor integrated circuit as set forth in claim 9, wherein said dielectric isolation region groove and said insulative leakage current blocking groove each have a V-shaped cross-section.
11. A semiconductor integrated circuit as set forth in claim 10, wherein insulative material is filled in said dielectric isolation groove and said insulative leakage current blocking region groove.
12. A semiconductor integrated circuit as set forth in claim 11, wherein said epitaxial layer has a surface with a plane index of [100].
13. A semiconductor integrated circuit as set forth in claim 3 or 11, wherein said semiconductor substrate has a plane index of [100].

14. A semiconductor integrated circuit as set forth in claim 1 or 9, wherein said insulative leakage current blocking region comprises an oxidized substance.

15. A semiconductor integrated circuit as set forth in claim 14, wherein said oxidized substance is silicon dioxide.

16. A semiconductor integrated circuit as set forth in claim 15, wherein said oxidized substance is aluminum oxide.

17. A semiconductor integrated circuit as set forth in claim 3 or 11, wherein said insulative leakage current blocking region comprises silicon nitride.

18. A semiconductor integrated circuit as set forth in claim 1 or 9, wherein said insulative leakage current blocking region comprises an insulation layer on which a polysilicon layer is formed.

* * * * *

UNITED STATES PATENT AND TRADEMARK OFFICE
CERTIFICATE OF CORRECTION

PATENT NO. : 4,320,411
DATED : March 16, 1982
INVENTOR(S) : TOSHITAKA FUKUSHIMA

It is certified that error appears in the above—identified patent and that said Letters Patent is hereby corrected as shown below:

Title page, assignee should read

-- Fujitsu Limited, Kawasaki-shi, Kanagawa, Japan --
      [56] References Cited, line 9, after "Cook" insert --, Jr.--.
Col. 1, line 62, delete "is"; after "substrate" (second occurrence) insert --,--.
Col. 2, line 31, ", and;" should be --; and--.
Col. 3, line 2, after "silicon" delete ","; 
     line 52, "[100]" should be -- (100) --.
Col. 4, line 20, after "n⁻" insert --type--;
     line 44, after "in" insert --a--;
     line 59, "[100]" should be --〈100〉--;
     line 61, "[100]" should be --〈100〉--.
Col. 6, line 9, "[100]" should be --〈100〉--;
     line 65, "[100]" should be --〈100〉--;
     line 68, "[100]" should be --〈100〉--.

Signed and Sealed this

Ninth Day of November 1982

[SEAL]

Attest:

Attesting Officer

GERALD J. MOSSINGHOFF
Commissioner of Patents and Trademarks